United States Patent
Wu et al.

(10) Patent No.: US 11,901,479 B2
(45) Date of Patent: Feb. 13, 2024

(54) SEMICONDUCTOR STRUCTURE, DISPLAY PANEL AND MANUFACTURING METHOD OF ELECTRONIC ELEMENT MODULE

(71) Applicant: PlayNitride Display Co., Ltd., MiaoLi County (TW)

(72) Inventors: Bo-Wei Wu, MiaoLi County (TW); Yu-Yun Lo, MiaoLi County (TW); Chien-Chen Kuo, MiaoLi County (TW); Chang-Feng Tsai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 226 days.

(21) Appl. No.: 17/325,179

(22) Filed: May 19, 2021

(65) Prior Publication Data
US 2022/0216365 A1 Jul. 7, 2022

(30) Foreign Application Priority Data
Jan. 5, 2021 (TW) ................................. 110100212

(51) Int. Cl.
*H01L 33/00* (2010.01)
*H01L 25/075* (2006.01)
(Continued)

(52) U.S. Cl.
CPC ...... *H01L 33/0095* (2013.01); *H01L 21/6835* (2013.01); *H01L 22/22* (2013.01);
(Continued)

(58) Field of Classification Search
CPC . H01L 33/0095; H01L 21/6835; H01L 22/22; H01L 25/0753; H01L 33/62;
(Continued)

(56) References Cited

U.S. PATENT DOCUMENTS

| 2012/0139898 A1* | 6/2012 | Cho | G09F 13/04 |
| | | | 345/1.3 |
| 2016/0155378 A1* | 6/2016 | Hack | H10K 59/35 |
| | | | 345/77 |

(Continued)

FOREIGN PATENT DOCUMENTS

| CN | 107026124 | 8/2017 |
| CN | 111933630 | 11/2020 |

(Continued)

OTHER PUBLICATIONS

"Office Action of China Counterpart Application", dated Nov. 3, 2022, p. 1-p. 10.

*Primary Examiner* — Ratisha Mehta
(74) *Attorney, Agent, or Firm* — JCIPRNET

(57) ABSTRACT

A manufacturing method of an electronic element module is provided. The method includes: disposing a plurality of first microelectronic elements on a first temporary substrate; and replacing at least one defective microelectronic element of the first microelectronic elements with at least one second microelectronic element. The first microelectronic elements and at least one second microelectronic element are distributed on the first temporary substrate. The first microelectronic elements and at least one second microelectronic element have same properties, and at least one of the appearance difference, the height difference and the orientation difference exists between the first microelectronic elements and at least one second microelectronic element. A semiconductor structure and a display panel are also provided.

12 Claims, 14 Drawing Sheets

(51) Int. Cl.
*H01L 21/66* (2006.01)
*H01L 21/683* (2006.01)
*H01L 33/62* (2010.01)
*G09G 3/32* (2016.01)

(52) U.S. Cl.
CPC .......... *H01L 25/0753* (2013.01); *H01L 33/62* (2013.01); *G09G 3/32* (2013.01); *H01L 2221/68354* (2013.01); *H01L 2221/68368* (2013.01); *H01L 2933/0066* (2013.01)

(58) Field of Classification Search
CPC ........... H01L 2221/68354; H01L 2221/68368; G09G 3/32
See application file for complete search history.

(56) References Cited

U.S. PATENT DOCUMENTS

| | | |
|---|---|---|
| 2018/0190876 A1 | 7/2018 | Liu et al. |
| 2019/0081200 A1 | 3/2019 | Ting et al. |
| 2019/0181122 A1 | 6/2019 | Hsu et al. |
| 2019/0206849 A1* | 7/2019 | Jang ..................... H01L 33/405 |

FOREIGN PATENT DOCUMENTS

| | | |
|---|---|---|
| JP | 2003209295 | 7/2003 |
| TW | 201826518 | 7/2018 |
| TW | 202019599 | 6/2020 |
| TW | I697036 | 6/2020 |

\* cited by examiner

SEMICONDUCTOR STRUCTURE, DISPLAY PANEL AND MANUFACTURING METHOD OF ELECTRONIC ELEMENT MODULE

CROSS-REFERENCE TO RELATED APPLICATION

This application claims the priority benefit of Taiwan application serial no. 110100212, filed on Jan. 5, 2021. The entirety of the above-mentioned patent application is hereby incorporated by reference herein and made a part of this specification.

BACKGROUND

Technical Field

The disclosure relates to an electronic element module and a manufacturing method thereof, particularly to a semiconductor structure, a display panel, and a manufacturing method thereof.

Description of Related Art

In the manufacturing process of a display panel with microelectronic elements, it is quite common to transfer a plurality of microelectronic elements to a target substrate and connect other elements to the target substrate. For example, in the process of manufacturing a micro-light-emitting diode (micro LED) display panel, a huge amount of micro-light-emitting diodes needs to be transferred to the display substrate and electrically connected with the driving circuit layer of the display substrate. However, these microelectronic elements may have defects during their growth, resulting in one or more defective microelectronic elements. In order to increase production yield and to reduce production costs, it is urgent to develop a method capable of replacing these defective microelectronic elements efficiently.

SUMMARY

The disclosure provides a semiconductor structure, a display panel, and a manufacturing method of an electronic element module, adapted to provide high production yield and low production costs.

According to an embodiment of the present disclosure, a semiconductor structure is provided, and the semiconductor structure includes a substrate, a plurality of first microelectronic elements, and at least one second microelectronic element. The first microelectronic elements and at least one second microelectronic element are distributed on the substrate. The first microelectronic elements and at least one second microelectronic element have the same properties, and at least one of appearance difference, height difference, and orientation difference exists between the first microelectronic elements and at least one second microelectronic element.

According to another embodiment of the present disclosure, a display panel is provided, and the display panel includes a display substrate, a plurality of first microelectronic elements, and at least one second microelectronic element. The first microelectronic elements and at least one second microelectronic element are distributed on the display substrate and electrically connected to the display substrate. The first microelectronic elements and at least one second microelectronic element have the same properties, and at least one of appearance difference, height difference, and orientation difference exists between the first microelectronic element and at least one second microelectronic element.

Accordant to yet another embodiment of the present disclosure, a manufacturing method of an electronic element module is provided, and the manufacturing method of the electronic element module includes: disposing a plurality of first microelectronic elements on a first temporary substrate; replacing at least one defective microelectronic element of the first microelectronic elements with at least one second microelectronic element, where the first microelectronic elements and at least one second microelectronic element are distributed on the first temporary substrate, the first microelectronic elements and at least one second microelectronic element have the same properties, and at least one of appearance difference, height difference, and orientation difference exists between the first microelectronic elements and at least one second microelectronic element.

According to yet another embodiment of the present disclosure, a semiconductor structure is provided, and the semiconductor structure includes a substrate, a plurality of first microelectronic elements, at least one second microelectronic element, a first buffer layer, and a second buffer layer. The first microelectronic elements and at least one second microelectronic element are distributed on the substrate, and the first microelectronic elements and at least one second microelectronic element have the same properties. The first buffer layer is disposed between the first microelectronic elements and the substrate. The second buffer layer is disposed between at least one second microelectronic device and the substrate, and at least one of material difference, appearance difference, height difference, and orientation difference exists between the first buffer layer and the second buffer layer.

Based on the above, the manufacturing method of the electronic element module provided by the embodiments of the present disclosure is adapted to replace defective microelectronic elements on the temporary substrate, so that there are no defective microelectronic elements on the temporary substrate, thereby improving production yield and reducing production costs. The semiconductor structure provided by the embodiments of the present disclosure does not have defective microelectronic elements, thereby improving production yield of electronic modules subsequently manufactured (such as display panels) and reducing production costs.

The accompanying drawings are included to provide a further understanding of the disclosure, and are incorporated in and constitute a part of this specification.

DESCRIPTION OF THE EMBODIMENTS

Please refer to FIG. 1A to FIG. 1H, which show a manufacturing method of an electronic element module according to an embodiment of the disclosure.

Figure 1A:
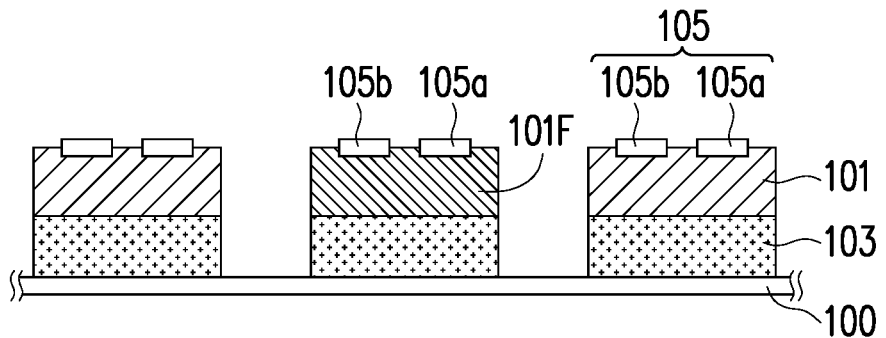
FIG. 1A to FIG. 1H show a manufacturing method of an electronic element module according to an embodiment of the disclosure.

FIG. 1A shows that a first buffer layer 103 is provided on a first temporary substrate 100, and a plurality of first microelectronic elements 101 are provided on the first buffer layer 103, where each of the first microelectronic elements 101 includes an electrode 105. Among them, the first temporary substrate 100 may be, for example, a plastic substrate, a ceramic substrate, a glass substrate, a sapphire substrate, or other substrates without driving circuit. The electrode 105 has at least two sub-electrodes 105a and 105b having opposite electrical polarities, and may be disposed between the first microelectronic element 101 and the first buffer layer 103 or respectively on both sides of the first microelectronic element 101, to which the disclosure does not limit. However, due to the yield problem of the manufacturing process, a defective microelectronic element 101F may appear on the first temporary substrate 100. It should be noted that this embodiment shows only one defective microelectronic element 101F, which is merely taken as an example. However, the present disclosure does not limit this. The number of the defective microelectronic element 101F on the first temporary substrate 100 may be plural, and the defective microelectronic element 101F may randomly occur among the first microelectronic element 101. In addition, the first microelectronic elements 101 and the defective microelectronic element 101F are distributed on the first temporary substrate 100 in a two-dimensional manner, despite that FIG. 1A only shows a cross-sectional view.

Figure 1B:
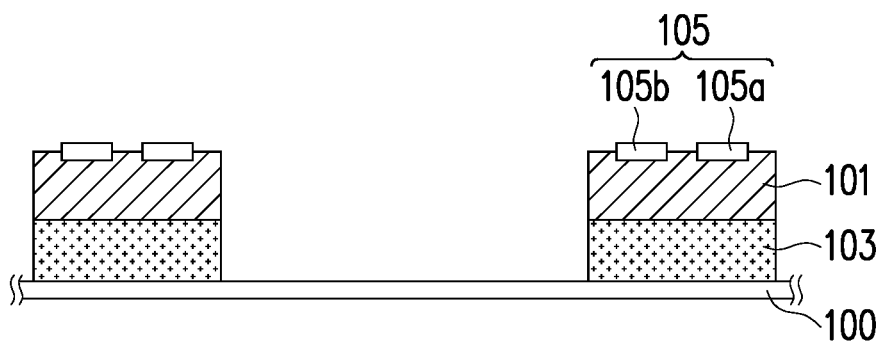

FIG. 1B shows that the defective microelectronic device 101F and the first buffer layer 103 underneath it are removed. In other words, the defective microelectronic element 101F and a portion of the first buffer layer 103 corresponding to the defective microelectronic element 101F are removed from the first temporary substrate 100. According to an embodiment of the present disclosure, a laser may be adopted to irradiate the portion of the first buffer layer 103 where it is below the defective microelectronic element 101F to decompose this portion of the first buffer layer 103, so that the defective microelectronic element 101F and this portion of the first buffer layer 103 may be detached from the first temporary substrate 100. However, as long as the bonding force of the defective microelectronic element 101F and this portion of the first buffer layer 103 may be reduced, the present disclosure does not limit this. According to another embodiment of the present disclosure, the defective microelectronic element 101F and the portion of the first buffer layer 103 under it may be directly picked up from the first temporary substrate 100 by decomposing the first buffer layer 103.

Figure 1C:
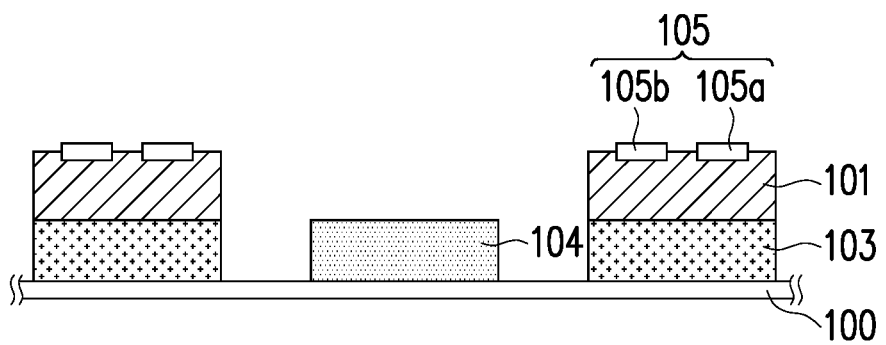

FIG. 1C shows that a second buffer layer 104 is further provided on the first temporary substrate 100 where the portion of the first buffer layer 103 is removed. It should be noted that in FIG. 1C, the material of the second buffer layer 104 is the same as that of the first buffer layer 103, to which the present disclosure is not limited. The material of the second buffer layer 104 may also be different from that of the first buffer layer 103.

In addition, in FIG. 1C, the size of the second buffer layer 104 is the same as the size of the first buffer layer 103, to which the present disclosure is not limited. The size of the second buffer layer 104, such as its width and thickness, may also be different from the size of the first buffer layer 103.

Figure 1D:
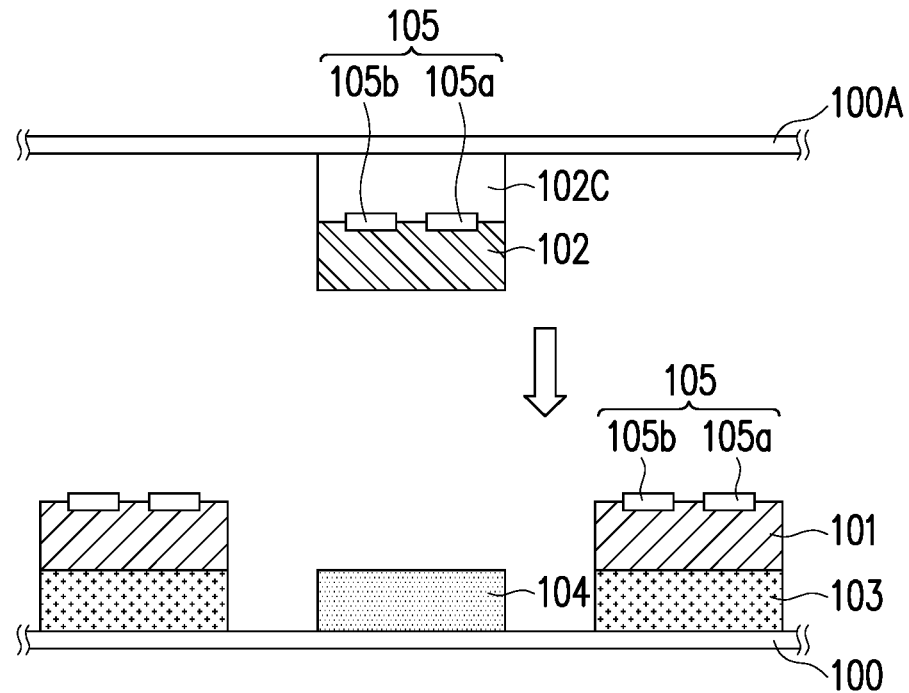

FIG. 1D shows a second temporary substrate 100A disposed opposite to the first temporary substrate 100, and that a second microelectronic element 102 on the second temporary substrate 100A is opposite to the second buffer layer 104. The second microelectronic element 102 has an electrode 105, and the second microelectronic element 102 is connected to the second temporary substrate 100A through a connection pad 102C. The second microelectronic element 102 and the first microelectronic elements 101 are elements with the same properties. For example, they are micro-light-emitting diodes of the same color. For example, the second microelectronic element 102 and the first microelectronic elements 101 are all red micro-light-emitting diodes, all green micro-light-emitting diodes, or all blue micro-light-emitting diodes. Some embodiments are also applied to other microelectronic elements, including microelectronic elements controlled to perform predetermined electronic functions (such as diodes, transistors, and/or integrated circuits) or microelectronic elements with photonic functions (such as laser diodes and/or photodiodes). Other embodiments of the present disclosure may also be applied to microchips including circuits, for example, Si or SOI wafers adapted for logic or memory application microchips, or GaAs wafers adapted for RF communication applications.

Figure 1E:
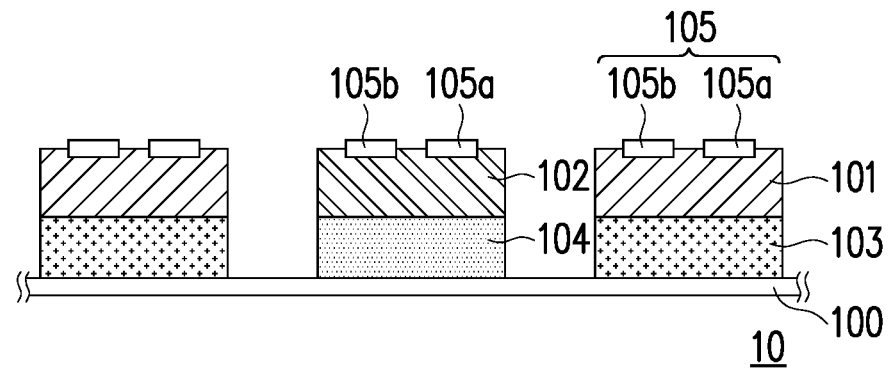

FIG. 1E shows that the second microelectronic element 102 is detached from the second temporary substrate 100A to be disposed on the second buffer layer 104. According to an embodiment of the present disclosure, the connection pad 102C of the second microelectronic element 102 may be irradiated with a laser to decompose the connection pad 102C, so that the second microelectronic element 102 is detached from the second temporary substrate 100A.

In the process shown in FIG. 1A to FIG. 1E, the defective microelectronic element 101F on the first temporary substrate 100 is replaced with the second microelectronic element 102. Note particularly that, in FIG. 1D, the number of the second microelectronic elements 102 may be one or more. In an embodiment of the present disclosure, the number of the second microelectronic element 102 is one, and in this situation, only one defective microelectronic element 101F is replaced with the second microelectronic element 102. In another embodiment of the present disclosure, the number of the second microelectronic elements 102 is plural, and under such situation, a plurality of defective microelectronic elements 101F are replaced with the second microelectronic elements 102. Besides, the second microelectronic element 102 may randomly occur among the first microelectronic element 101.

In this embodiment, FIG. 1A to FIG. 1E show how to manufacture a semiconductor structure 10 in FIG. 1E using the manufacturing method of an electronic element module according to an embodiment of the present disclosure. The semiconductor structure 10 includes a first temporary substrate 100, a plurality of first microelectronic elements 101, and a second microelectronic element 102. In other words, the manufacturing method of the electronic element module provided by the embodiment of the present disclosure replaces the defective microelectronic element 101F on the first temporary substrate 100, and as a result, there are almost no defective microelectronic elements 101F existing on the manufactured semiconductor structure 10, thereby improving production yield of electronic devices to be subsequently manufactured and reducing production costs.

As mentioned above, in some embodiments of the present disclosure, a laser is adopted to decompose the first buffer layer 103 under the defective microelectronic element 101F, such that the defective microelectronic element 101F is detached from the first temporary substrate 100, and a laser is also adopted to decompose the connection pad 102C, such that the second microelectronic element 102 is detached from the second temporary substrate 100A. Based on the characteristic that the laser beam irradiates the position accurately, this manufacturing method improves the efficiency of replacing the defective microelectronic element 101F with the second microelectronic element 102.

In the semiconductor structure 10, the first microelectronic elements 101 and the second microelectronic elements 102 are distributed on the first temporary substrate 100, for example, in an array. The first microelectronic elements 101 and the second microelectronic elements 102 have the same properties. For example, they are all red light-emitting diodes.

In the semiconductor structure 10 shown in FIG. 1E, since the first microelectronic elements 101 and the second microelectronic elements 102 may come from different growth wafers, the first microelectronic elements 101 and the second microelectronic elements 102 may have appearance differences, such as differences in size or apparent color.

In the semiconductor structure 10 shown in FIG. 1E, there is no size difference between the first buffer layer 103 and the second buffer layer 104, but the present disclosure is not limited thereto. The first buffer layer 103 and the second buffer layer 104 may have different appearances. For example, the size of the first buffer layer 103 and the size of the second buffer layer 104 may be different. Or, for example, in an embodiment of the present disclosure, the thickness of the second buffer layer 104 is different from the thickness of the first buffer layer 103, so there is a height difference between the first microelectronic element 101 and the second microelectronic element 102. By providing the second buffer layer 104 in a size that may be different from the size of the first buffer layer 103, the replacement process in which the second microelectronic element 102 replaces the defective microelectronic element 101F becomes more flexible and according to the defective condition of the defective microelectronic element 101F, which increases the yield rate and reduces the repair costs. For example, the thickness of the second buffer layer 104 is greater than the thickness of the first buffer layer 103, and in this way, when the defective microelectronic element 101F is replaced by the second microelectronic element 102, the non-defective first microelectronic element 101 therearound are not affected. Furthermore, since the first microelectronic elements 101 are disposed on the first temporary substrate 100 in the step shown in FIG. 1A, whereas the second microelectronic element 102 is disposed on the first temporary substrate 100 in the step shown in FIG. 1D, the two are disposed on the first temporary substrate 100 in different steps. Therefore, the first microelectronic elements 101 and the second microelectronic element 102 may have orientation differences, such as gap differences. According to an embodiment of the present disclosure, when the number of the second microelectronic elements 102 disposed on the first temporary substrate 100 is plural, the differences in gap between these second microelectronic elements 102 and the first microelectronic elements 101 are the same to one another. In other words, the gaps between the first microelectronic elements 101 are the same as one another, and the gaps between the second microelectronic elements 102 are the same as one another. In addition, the gap between the second microelectronic elements 102 and the gap between the first microelectronic elements 101 are different. According to some embodiments of the present disclosure, the material of the first buffer layer 103 and the material of the second buffer layer 104 may be the same or different from each other. For example, the material of the second buffer layer 104 is different from the material of the first buffer layer 103. Preferably, the Young's modulus of the second buffer layer 104 is less than the Young's modulus of the first buffer layer 130, and in this way, when the defective microelectronic element 101F is replaced by the second microelectronic element 102, the non-defective first microelectronic element 101 therearound are not affected. According to some embodiments of the present disclosure, the color of the first buffer layer 103 and the color of the second buffer layer 104 may be the same or different from each other. According to some embodiments of the present disclosure, the thickness of the first buffer layer 103 and the thickness of the second buffer layer 104 may be the same or different from each other. According to some embodiments of the present disclosure, the width of the first buffer layer 103 and the width of the second buffer layer 104 may be the same or different from each other. For example, the width of the second buffer layer 104 is greater than the width of the first buffer layer 103, and in this way, when the defective microelectronic element 101F is replaced by the second microelectronic element 102, the non-defective first microelectronic element 101 therearound are not affected, and there is a larger bonding surface for the second microelectronic element 102 to achieve better yield. Next, please refer to FIG. 1F, which shows: the semiconductor structure 10 is disposed opposite to a display substrate 106. The display substrate 106 is, for example, a substrate with circuits or metal redistribution lines, provided with a driving circuit layer 107 which, for example, has transistors or integrated circuits (ICs) that may be electrically connected to the first microelectronic elements 101 and the second microelectronic element 102 to control the first microelectronic elements 101 and the second microelectronic element 102, to which there is no restriction here.

Figure 1F:
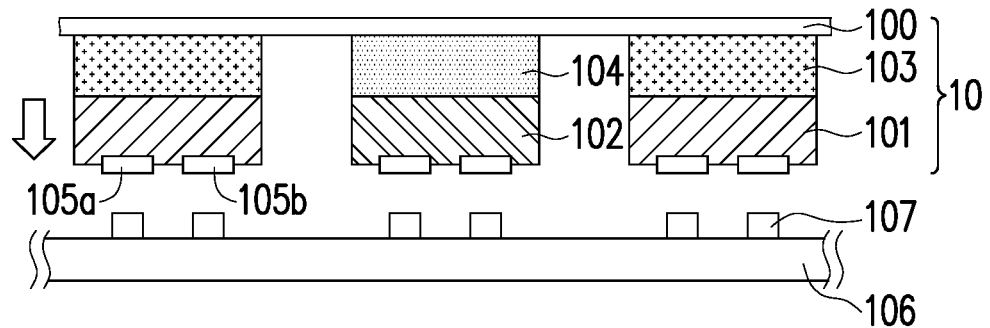
Figure 1G:
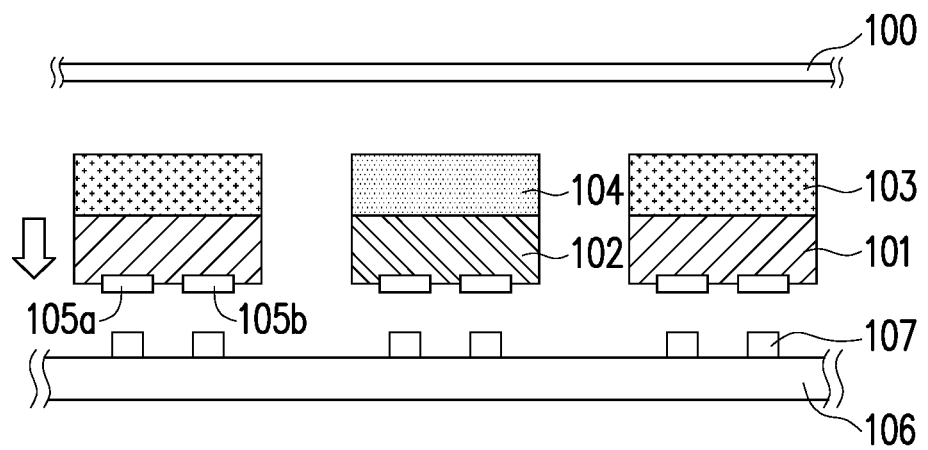

FIG. 1G shows that: the first microelectronic elements 101 and the second microelectronic element 102 are transferred to a display substrate 106.

Figure 1H:
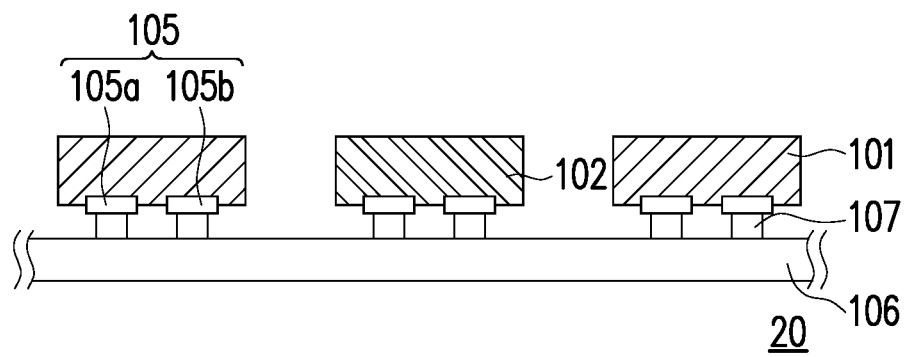

FIG. 1H shows that: the driving circuit layers 107 are electrically connected to the electrodes 105 of the first microelectronic elements 101, and the driving circuit layers 107 are also electrically connected to the electrodes 105 of the second microelectronic element 102.

Specifically, FIG. 1F to FIG. 1H shows how to manufacture the electronic element module 20 by using the manufacturing method of the electronic element module of the embodiment of the present disclosure, where the first microelectronic elements 101 and the second microelectronic element 102 are transferred from the semiconductor structure 10 to the display substrate 106 and are electrically connected to the driving circuit layers 107 of the display substrate 106. As described above, since there is no defective microelectronic element 101F in the semiconductor structure 10, almost no defective microelectronic element 101F is transferred to the display substrate 106, improving production yield of the electronic element module 20 and reducing production costs.

According to some embodiments of the present disclosure, the electronic element module 20 is implemented as a display panel, but the present disclosure is not limited thereto. The electronic element module 20 may be any electronic device having the first microelectronic elements 101 and the second microelectronic element 102.

Take the embodiment in which the electronic element module 20 is implemented as a display panel for example. The display panel 20 includes a display substrate 106, a plurality of first microelectronic elements 101, and a second microelectronic element 102. The display substrate 106 includes a driving circuit layer 107. The first microelectronic elements 101 and the second microelectronic elements 102 are distributed on the display substrate 106 in an array and are electrically connected to the display substrate 106. The first microelectronic elements 101 and the second microelectronic element 102 have the same properties. For example, they are both micro-light-emitting diodes of the same color, such as the same red micro-light-emitting diode, the same green micro-light-emitting diode, or the same blue micro-light-emitting diode.

Since the first microelectronic elements 101 and the second microelectronic element 102 may come from different growth wafers, the first microelectronic elements 101 and the second microelectronic element 102 may have differences in appearance, such as differences in apparent color and size. In addition, since there may be a size difference between the first microelectronic elements 101 and the second microelectronic element 102, there may be a height difference between the first microelectronic elements 101 and the second microelectronic element 102 on the display substrate 106. For example, the height of the first microelectronic elements 101 is less than the height of the second microelectronic element 102, and in this way, when the defective microelectronic element 101F is replaced by the second microelectronic element 102, the non-defective first microelectronic element 101 therearound are not affected.

In addition, since the first microelectronic elements 101 and the second microelectronic element 102 in the display panel 20 are transferred from the first temporary substrate 100 to the display substrate 106, when the first microelectronic elements 101 and the second microelectronic element 102 of the semiconductor structure 10 have an orientation difference, such orientation difference may also be transferred from the first temporary substrate 100 to the display substrate 106. However, because this orientation difference is less than 10%, it does not affect the subsequent display effect. The ratio of the second microelectronic element 102 to the sum of the first microelectronic elements 101 and the second microelectronic element 102 on the first temporary substrate 100 when less than 30% does not affect the subsequent display effect. A subsequent displaying effect is not affected since there is not too many different microelectronic elements.

In general, the manufacturing method of an electronic element module provided by an embodiment of the present disclosure replaces defective microelectronic elements on a temporary substrate, leaving no defective microelectronic elements on the temporary substrate, thereby improving production yield of electronic modules subsequent manufactured (such as display panels) and reducing production costs.

In order to fully illustrate various embodiments of the present disclosure, other embodiments of the present disclosure are described below. It must be noted here that the following embodiments adopt the element numbers and part of the content of the foregoing embodiments, where the same numbers are used to represent the same or similar elements, and the description of the same technical content is omitted. For the description of the omitted parts, please refer to the foregoing embodiments, and the following embodiments do not repeat the same descriptions.

Figure 2:
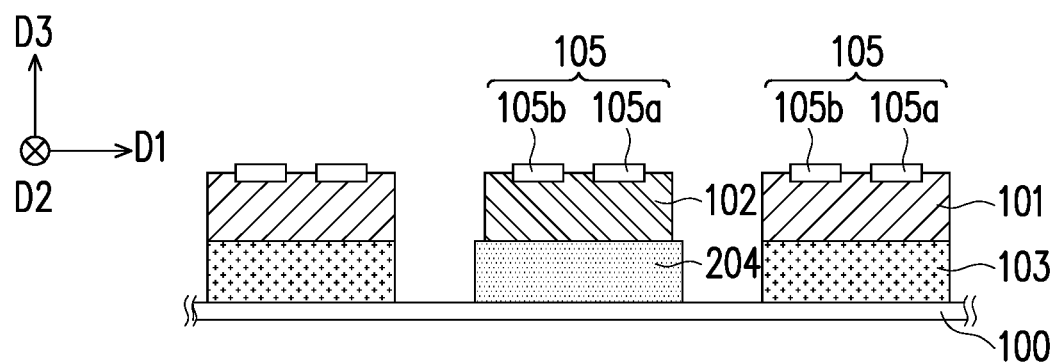
FIG. 2 and FIG. 3A show semiconductor structures according to embodiments of the disclosure.

Next, please refer to FIG. 2, which shows a semiconductor structure according to an embodiment of the present disclosure. A semiconductor structure 200 includes a first temporary substrate 100, a plurality of first microelectronic elements 101, and a second microelectronic element 102. A first buffer layer 103 is provided between the first microelectronic elements 101 and the first temporary substrate 100. A second buffer layer 204 is provided between the second microelectronic element 102 and the first temporary substrate 100. The semiconductor structure 200 is different from the aforementioned semiconductor structure 10 in that the width of the second buffer layer 204 in a direction D1 perpendicular to the normal line of the first temporary substrate 100 is different from that of the first buffer layer 103. For example, the width of the second buffer layer 104 is greater than the width of the first buffer layer 103, and in this way, when the defective microelectronic element 101F is replaced by the second microelectronic element 102, the non-defective first microelectronic element 101 therearound are not affected, and there is a larger bonding surface for the second microelectronic element 102 to achieve better yield.

Figure 3A:
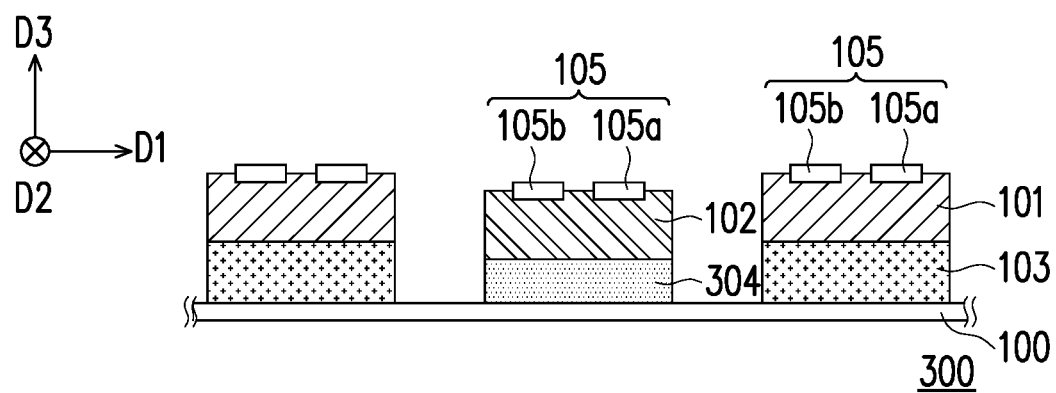
Figure 3B:
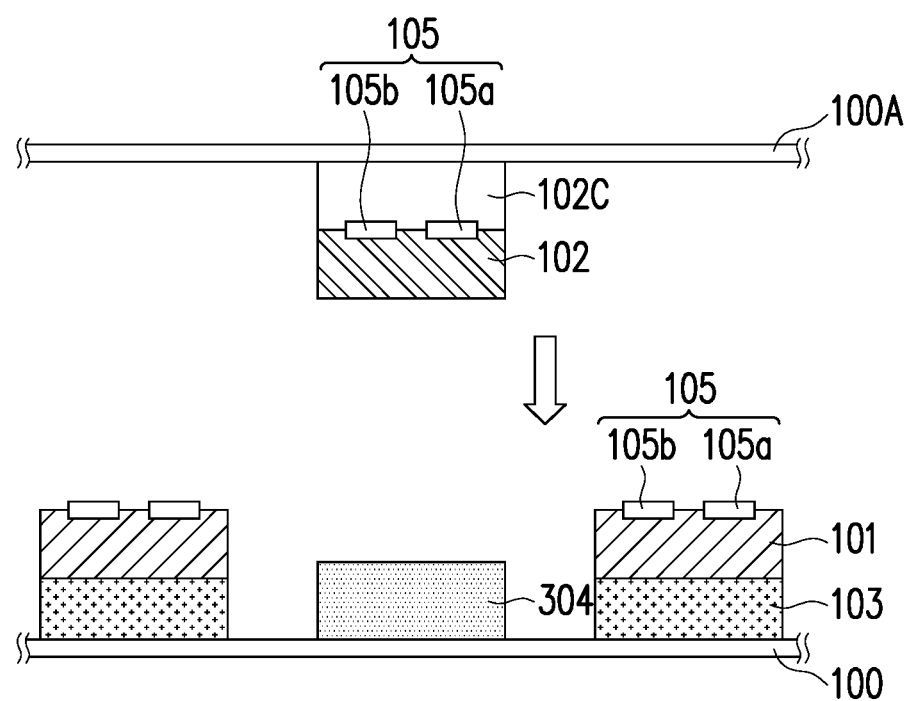
FIG. 3B shows a second temporary substrate disposed opposite to the first temporary substrate in another embodiment of the disclosure.

FIG. 3A shows a semiconductor structure according to an embodiment of the present disclosure. A semiconductor structure 300 includes a first temporary substrate 100, a plurality of first microelectronic elements 101, and a second microelectronic element 102. A first buffer layer 103 is provided between the first microelectronic elements 101 and the first temporary substrate 100. A second buffer layer 304 is provided between the second microelectronic element 102 and the first temporary substrate 100. The semiconductor structure 300 is different from the aforementioned semiconductor structure 10 in that the thickness of the second buffer layer 304 in a direction D3 parallel to the normal line of the first temporary substrate 100 is different from that of the first buffer layer 103, and that there is a height difference between the second microelectronic element 102 and the first microelectronic elements 101. Herein the thickness of the second buffer layer 304 is less the thickness of the first buffer layer 103 since the second buffer layer 304 bears a bonding press and provides buffering in the transfer process, or since the number of times of the transfer and repair process is more than one. In another embodiment, as shown in FIG. 3B, the initial thickness of the second buffer layer 304 may be greater than the thickness of the first buffer layer 103 when the second buffer layer 304 is disposed, and in this way, when the defective microelectronic element 101F is replaced by the second microelectronic element 102, the non-defective first microelectronic element 101 therearound are not affected, and there is a larger bonding surface for the second microelectronic element 102 to achieve better yield.

Figure 4A:
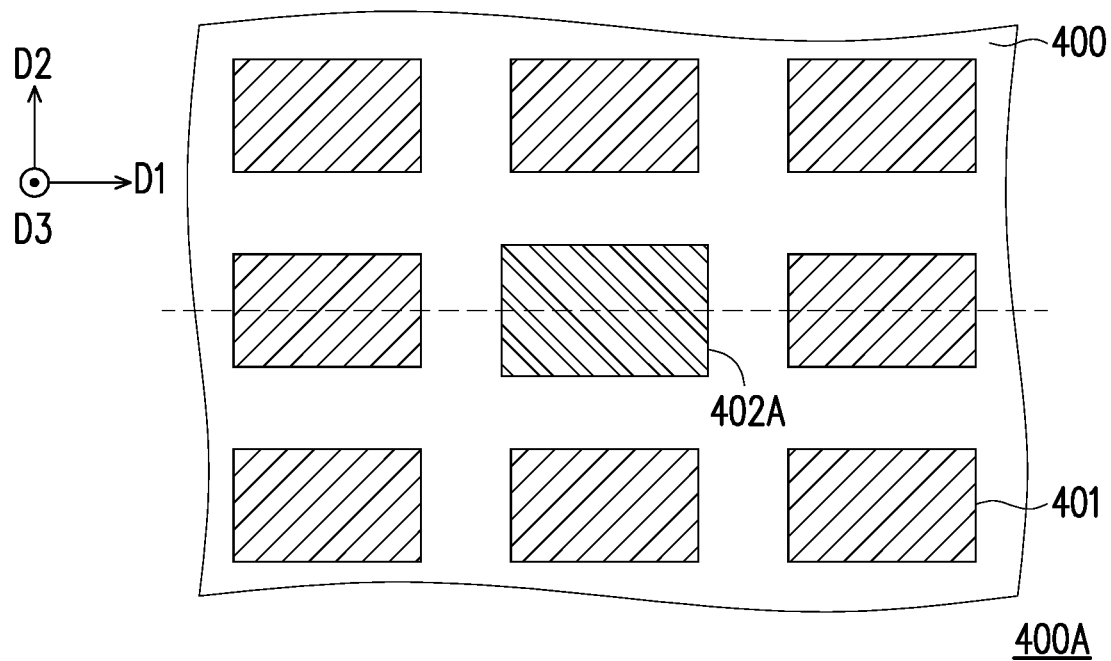
FIG. 4A to FIG. 4G show electronic element modules according to embodiments of the disclosure.

FIG. 4A shows an electronic element module according to an embodiment of the present disclosure. An electronic element module 400A includes a substrate 400, a plurality of first microelectronic elements 401, and a second microelectronic element 402A. The electronic element module 400A may be implemented as a semiconductor structure or a display panel. When the electronic element module 400A is implemented as a semiconductor structure, the substrate 400 may be the first temporary substrate 100 in the semiconductor structure 10 as shown in FIG. 1E. When the electronic element module 400A is implemented as a display panel, the substrate 400 may be the display substrate 106 of the display panel 20 as shown in FIG. 1H.

As shown in FIG. 4A, the apparent color of the first microelectronic elements 401 and the second microelectronic element 402A are different. In addition, the width of the second microelectronic element 402A in a direction D1 is slightly larger than the width of each first microelectronic element 401 in the direction D1, and the width of the second microelectronic element 402A in a direction D2 is slightly larger than the width of each first microelectronic element 401 in the direction D2. Therefore, the area of the second microelectronic element 402A is slightly larger than the area of each first microelectronic element 401, to which the present disclosure is not limited. According to some embodiments of the present disclosure, the width of the second microelectronic element 402A in the direction D1 may be slightly smaller than or equal to the width of each first microelectronic element 401 in the direction D1, and the width of the second microelectronic element 402A in the direction D2 may be slightly less than or equal to the width of each first microelectronic element 401 in the direction D2.

Specifically, according to the embodiments of the present disclosure, the size difference between the first microelectronic elements 401 and the second microelectronic element 402A meets the following conditional formula: 0<D12/W1≤10%, where W1 is the width of each first microelectronic element 401 in a direction perpendicular to the normal line of the substrate 400, D12 is the width difference between each first microelectronic element 401 and the second microelectronic element 402A in this direction, and D12 is a positive number. A size difference more than 10% affects the display effect after the subsequent transfer is made to the display panel.

Figure 4B:
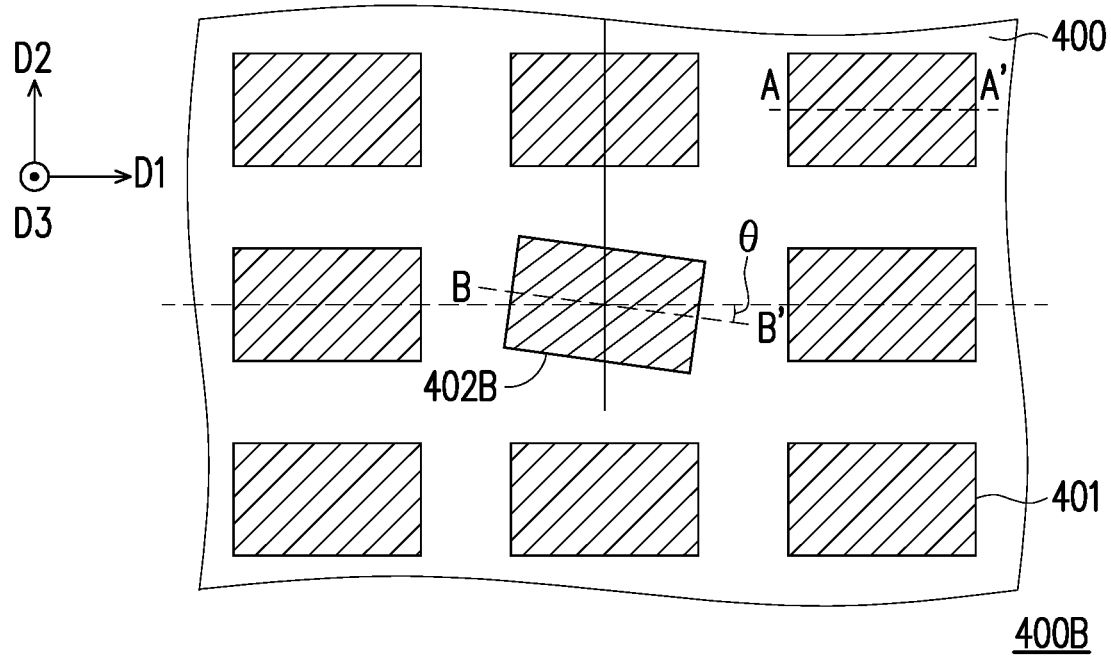

FIG. 4B shows an electronic element module according to an embodiment of the present disclosure. An electronic element module 400B includes a substrate 400, a plurality of first microelectronic elements 401, and a second microelectronic element 402B. The electronic element module 400B may be implemented as a semiconductor structure or a display panel. When the electronic element module 400B is implemented as a semiconductor structure, the substrate 400 may be the first temporary substrate 100 of the semiconductor structure 10 as shown in FIG. 1E. When the electronic element module 400B is implemented as a display panel, the substrate 400 may be the display substrate 106 of the display panel 20 as shown in FIG. 1H.

As shown in FIG. 4B, there is an orientation difference between the first microelectronic elements 401 and the second microelectronic element 402B. Specifically, each first microelectronic element 401 has an axis of symmetry AA', and the axis of symmetry AA' of each first microelectronic element 401 is parallel to a direction D1, whereas the second microelectronic element 402B has an axis of symmetry BB', and there is an included angle θ between the axis of symmetry BB' of the second microelectronic element 402B and the direction D1, where 0<θ≤45°. An included angle more than 45° affects the display effect after the subsequent transfer is made to the display panel.

Figure 4C:
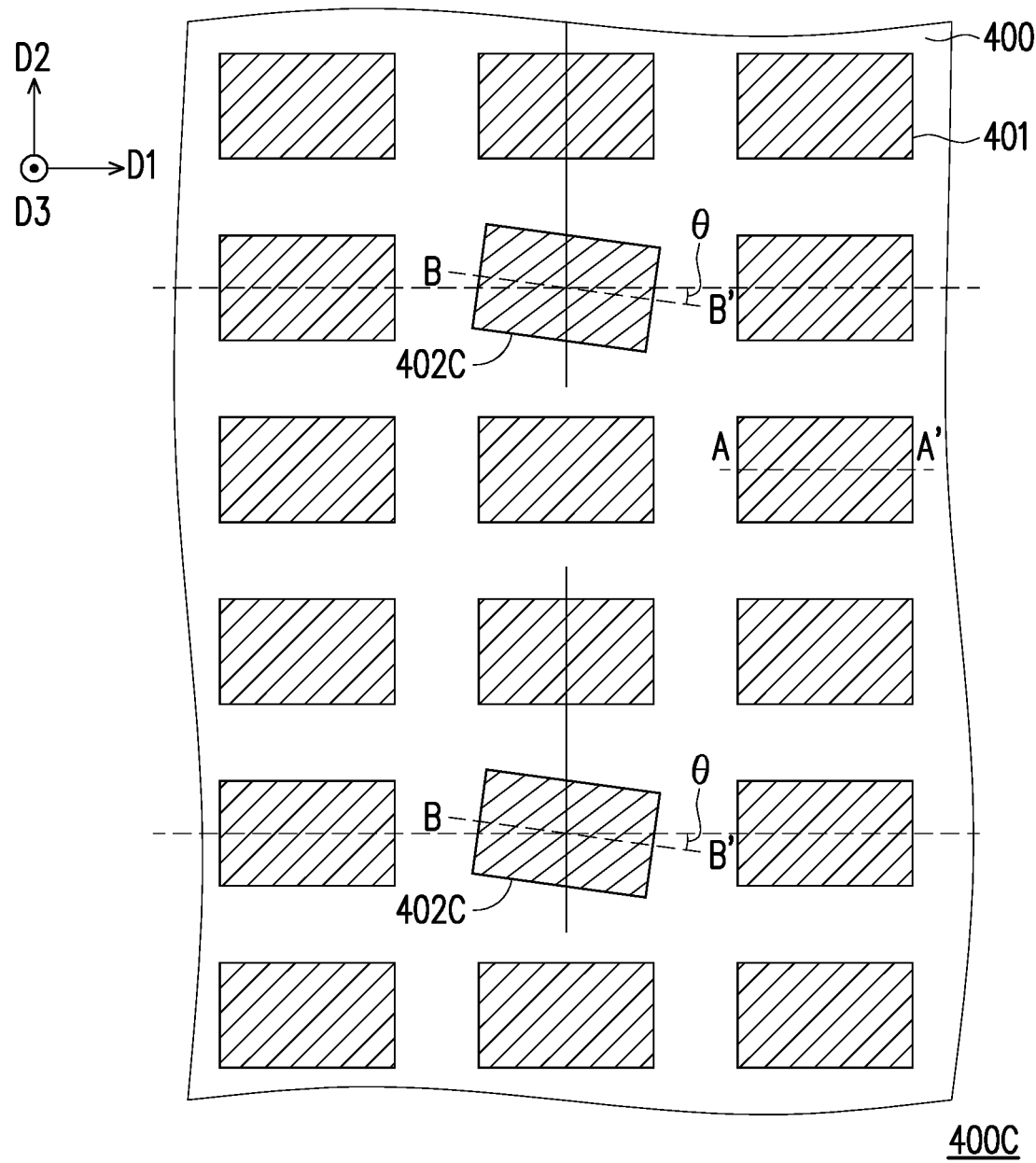

FIG. 4C shows an electronic element module according to an embodiment of the present disclosure. An electronic element module 400C includes a substrate 400, a plurality of first microelectronic elements 401, and a second microelectronic element 402C. The electronic element module 400C may be implemented as a semiconductor structure or a display panel. The electronic element module 400C includes a substrate 400, a plurality of first microelectronic elements 401, and a plurality of second microelectronic elements 402C. When the electronic element module 400C is implemented as a semiconductor structure, the substrate 400 may be the first temporary substrate 100 in the semiconductor structure 10 as shown in FIG. 1E. When the electronic element module 400C is implemented as a display panel, the substrate 400 may be the display substrate 106 in the display panel 20 as shown in FIG. 1H.

As shown in FIG. 4C, each first microelectronic element 401 has an axis of symmetry AA', and the axis of symmetry AA' of each first microelectronic element 401 is parallel to a direction D1, whereas each second microelectronic element 402C has an axis of symmetry BB', and there is an included angle θ between the axis of symmetry BB' of each second microelectronic element 402C and the direction D1, where 0<θ≤45°. The included angles between different second microelectronic elements 402C and the direction D1 are the same. Specifically, the orientations of the first microelectronic elements 401 are the same as one another, the orientations of the second microelectronic elements 402C are the same as each other, the orientations of the first microelectronic elements 401 and the second microelectronic elements 402C are different from each other, and the orientation difference between these two groups is fixed.

Figure 4D:
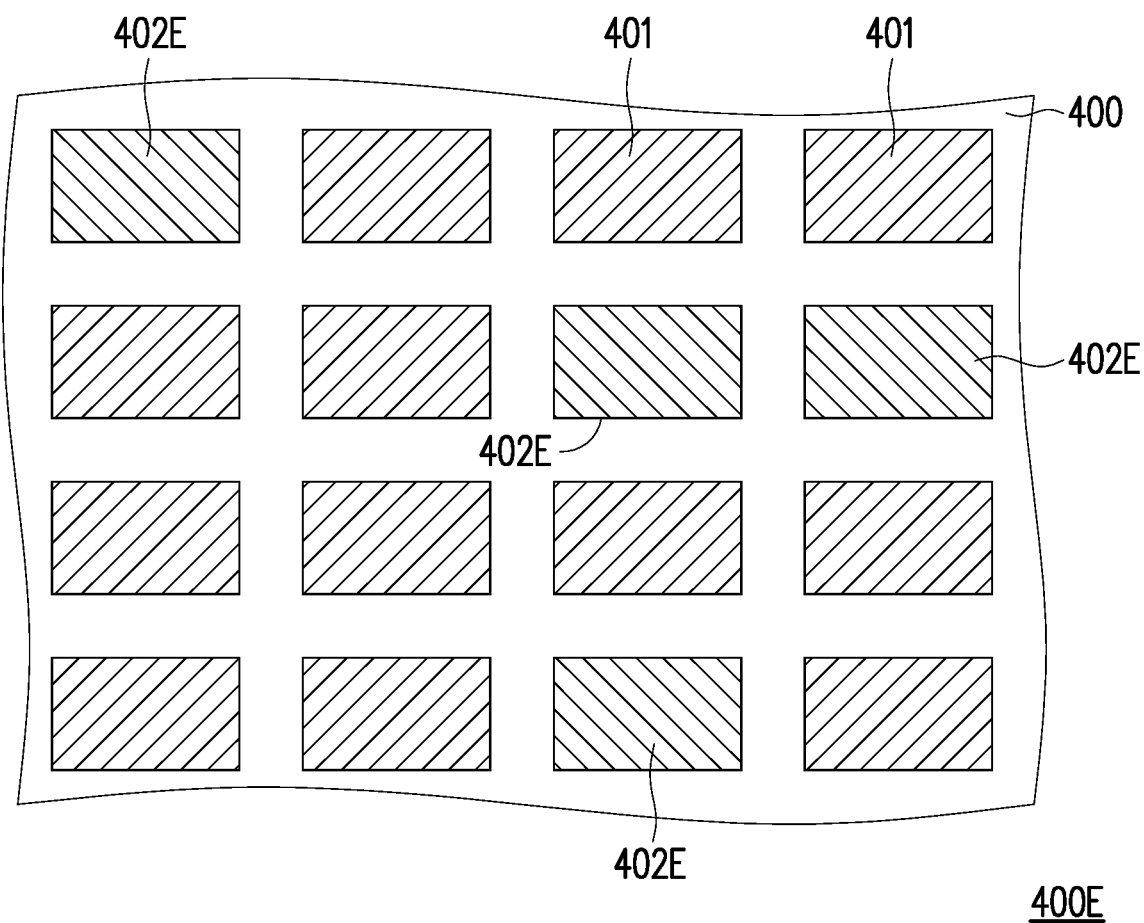

FIG. 4D shows an electronic element module according to an embodiment of the present disclosure. An electronic element module 400E includes a substrate 400, a plurality of first microelectronic elements 401, and at least one second microelectronic element 402E. The electronic element module 400E may be implemented as a semiconductor structure or a display panel. When the electronic element module 400E is implemented as a semiconductor structure, the substrate 400 may be the first temporary substrate 100 of the semiconductor structure 10 as shown in FIG. 1E. When the electronic element module 400E is implemented as a display panel, the substrate 400 may be the display substrate 106 of the display panel 20 as shown in FIG. 1H. As shown in FIG. 4D, when the defective microelectronic elements 101F are replaced by the second microelectronic elements 402E, the second microelectronic elements 402E can be randomly disposed on defective positions on the temporary substrate, for example.

Figure 4E:
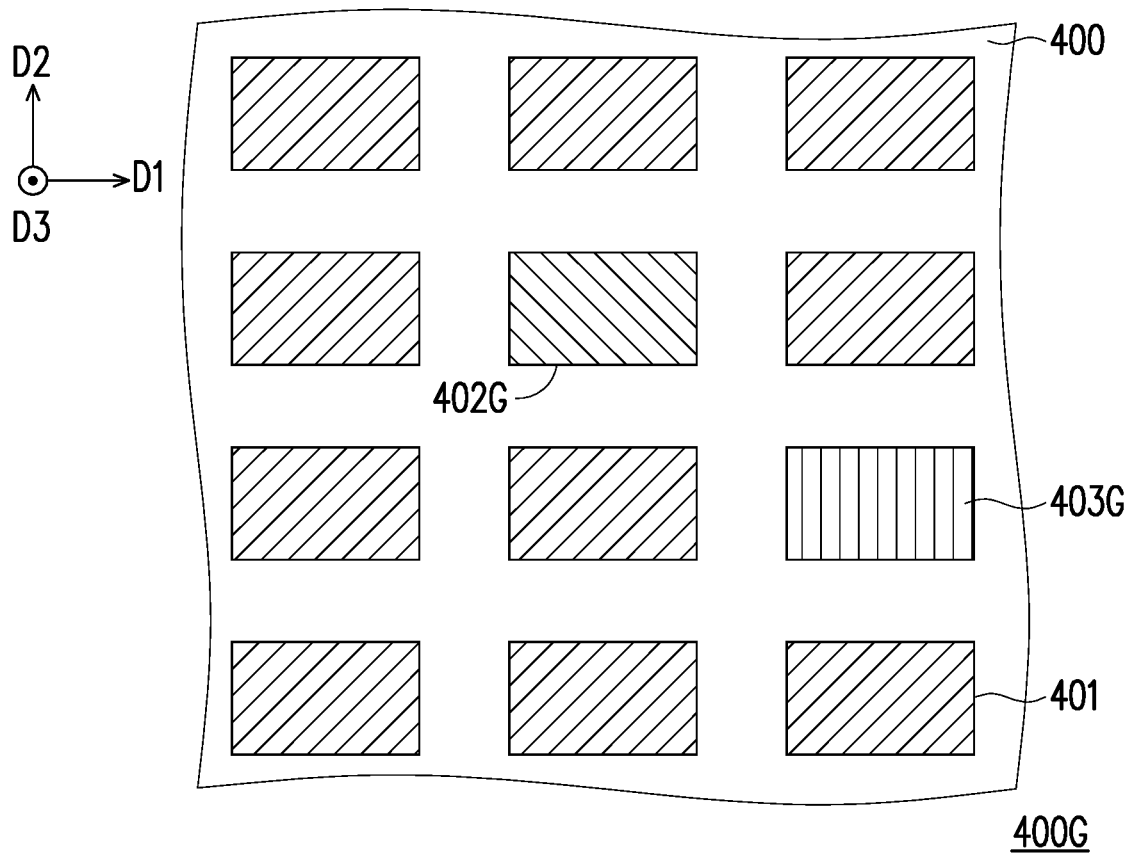

In an embodiment, as shown in FIG. 4E, an electronic element module 400G may include a substrate 400, a plurality of first microelectronic elements 401, a second microelectronic element 402G, and a third microelectronic element 403G. The number of the second microelectronic element 402G and the third microelectronic element 403G may be one or more, and the second microelectronic element 402G and the third microelectronic element 403G may be transferred to the substrate 400 through different temporary substrates. Specifically, different temporary substrates may be used to transfer the second microelectronic element 402G and the third microelectronic element 403G to the substrate 400 of the electronic element module in different stage of the transfer process to repair defective microelectronic elements 101F. Under this situation, at least one of appearance difference, height difference, and orientation difference exists among two of the three that are the first microelectronic elements 401, the second microelectronic element 402G, and the third microelectronic element 403G.

Figure 4F:
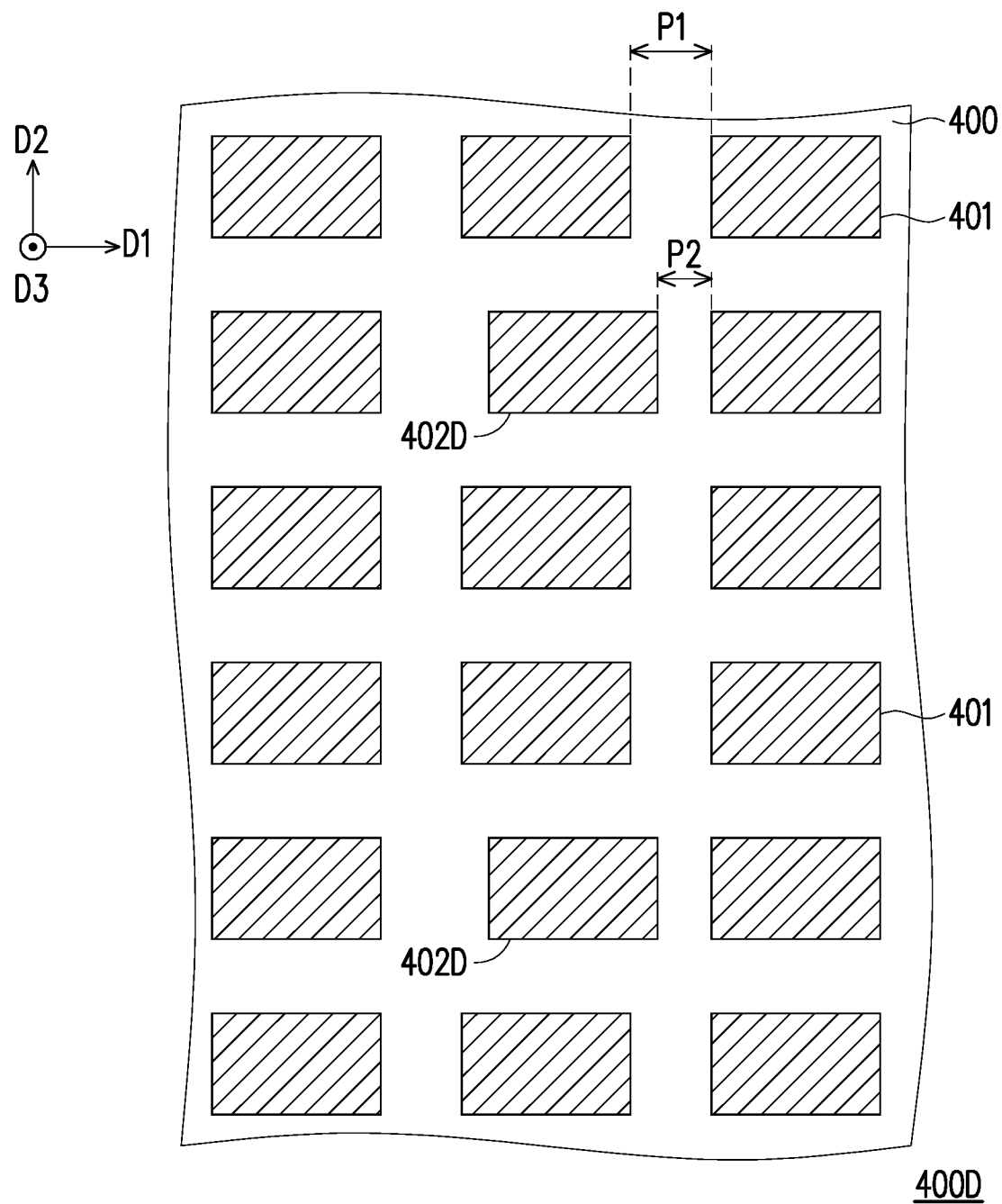

FIG. 4F shows an electronic element module according to an embodiment of the present disclosure. An electronic element module 400D includes a substrate 400, a plurality of first microelectronic elements 401, and a plurality of second microelectronic elements 402D. The gaps between the first microelectronic elements 401 are the same as each other. The gaps between the second microelectronic elements 402D are the same as each other. And the gaps between the second microelectronic elements 402D and the first microelectronic elements 401 are different. In other words, there is a gap difference between the second microelectronic elements 402D and the first microelectronic elements 401. Specifically speaking, the gap between the first microelectronic elements 401 is P1, the minimum gap between the first microelectronic elements 401 and the second microelectronic elements 402D is P2, and P1 and P2 define the gap difference between the second microelectronic elements 402D and the first microelectronic elements 401. The gap differences meets the following conditional formula: 90%≤P2/P1<1. In other words, the gap difference is less than 10%, and a gap difference more than 10% affects the display effect after the subsequent transfer is made to the display panel. Specifically speaking, on the repaired temporary substrate, the gap between the first microelectronic elements 401 is P1, the minimum gap between the first microelectronic elements 401 and the second microelectronic elements 402D is P2, wherein each of P1 and P2 is less than the dimensions of widths and lengths of the first microelectronic element 401 or the second microelectronic element 402D. Therefore, more microelectronic elements may be disposed on the temporary substrate, so that better space using rate may be achieved before the microelectronic elements are finally transferred to the display substrate.

Figure 4G:
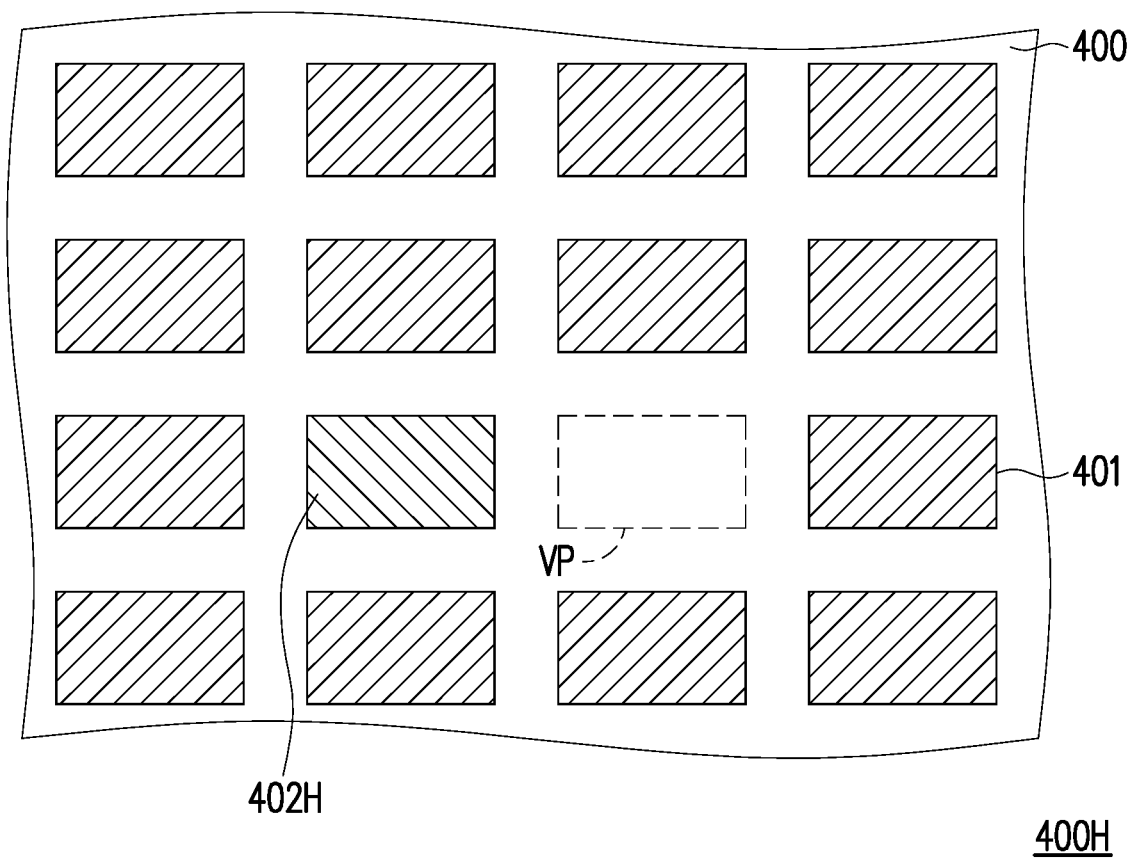

FIG. 4G shows an electronic element module according to an embodiment of the present disclosure. Referring to FIG. 4G, an electronic element module 400H includes a substrate 400, a plurality of first microelectronic elements 401, and at least one second microelectronic element 402H. The electronic element module 400H may be implemented as a semiconductor structure or a display panel. When the electronic element module 400H is implemented as a semiconductor structure, the substrate 400 may be the first temporary substrate 100 of the semiconductor structure 10 as shown in FIG. 1E. When the electronic element module 400H is implemented as a display panel, the substrate 400 may be the display substrate 106 of the display panel 20 as shown in FIG. 1H. Herein, there is at least one vacancy position VP on the substrate 400. When the second microelectronic element 402H is still defective during the repair process, the defective second microelectronic element 402 may be removed to form the vacancy position VP. In this case, at least one third microelectronic element (not shown) may be disposed at the vacancy position VP. Alternatively, when the number of the vacancy positions VP is not large, for example, being less than 10% of the total number of the first microelectronic elements 401 and the second microelectronic elements 402H, the further repair is not performed to avoid reducing the manufacturing yield of the semiconductor structure since the subsequent display effect is not affected. Moreover, this can also increase the manufacturing yield of subsequently transferring the microelectronic elements onto the display substrate.

Figure 5A:
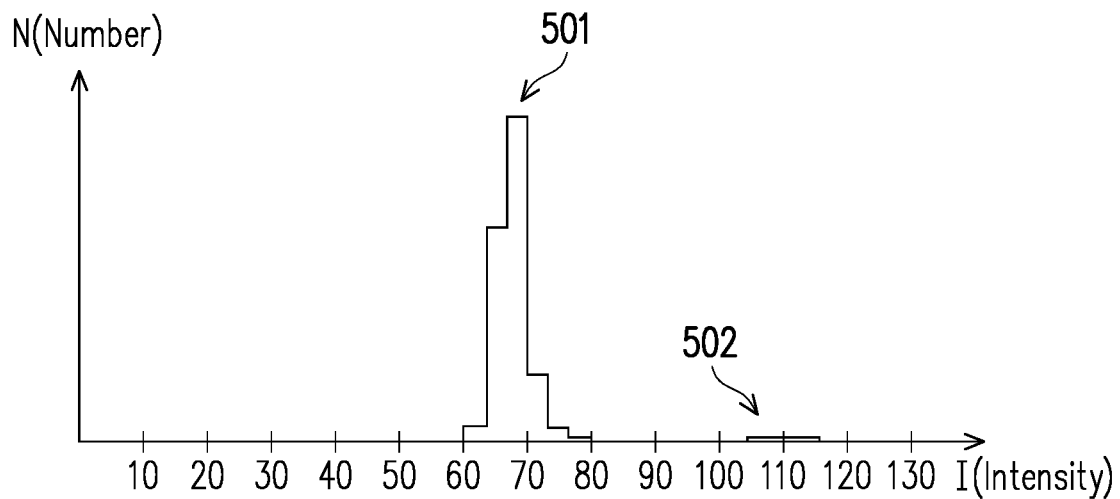
FIG. 5A is a schematic diagram of the luminous-intensity distribution of micro-light-emitting diodes of a display panel according to an embodiment of the disclosure.
Figure 5B:
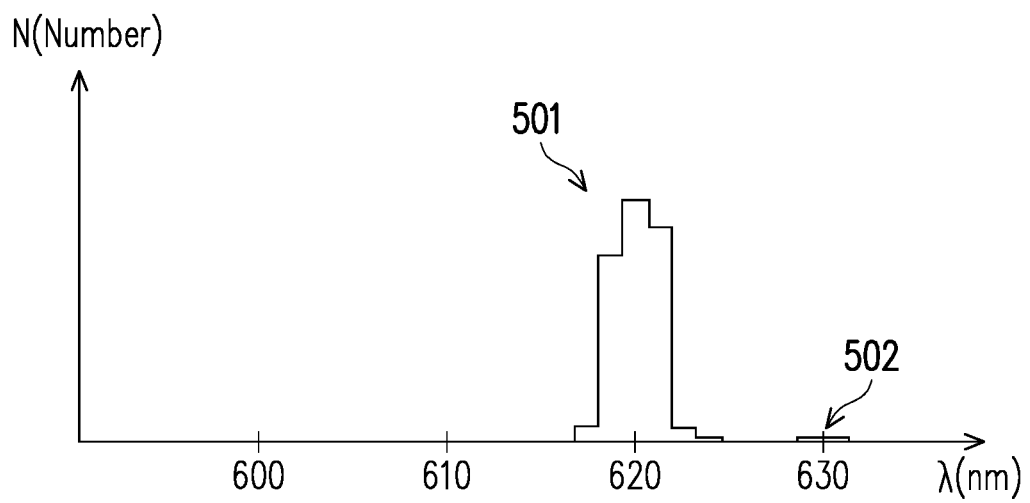
FIG. 5B is a schematic diagram of the light-emission wavelength distribution of micro-light-emitting diodes of a display panel according to the embodiment of the disclosure.

FIG. 5A and FIG. 5B respectively are the luminous-intensity distribution diagram and the emission wavelength distribution diagram of the microelectronic elements of the display panel according to an embodiment of the present disclosure.

In FIG. 5A, the horizontal axis represents the luminous intensity (arbitrary unit), the vertical axis represents the number of electronic elements, and the first strip 501 represents the first microelectronic element, and the second strip 502 represents the second microelectronic element. In FIG. 5B, the horizontal axis represents the emission wavelength (nm), the vertical axis represents the number of microelectronic elements, and similarly, the first strip 501 represents the first microelectronic element, and the second strip 502 represents the second microelectronic element.

In this embodiment, the electronic element module 400C shown in FIG. 4C is implemented as a display panel, the first microelectronic element 401 is implemented as a first micro-light-emitting diode, and the second microelectronic element 402C is implemented as a second micro-light-emitting diode. It can be indicated from the description of each embodiment above that the first microelectronic element 401 and the second microelectronic element 402C have the same properties. Therefore, it may be inferred that when the first microelectronic element 401 is implemented as the first micro-light-emitting diode and the second microelectronic element 402C is implemented as the second micro-light-emitting diode, the first micro-light-emitting diode and the second micro-light-emitting diode here may be, for example, red micro-light-emitting diodes. However, in embodiments not shown in the drawings, they may be green micro-light-emitting diodes or blue micro-light-emitting diodes. In other words, the first micro-light-emitting diode and the second micro-light-emitting diode emit light of the same color. However, since the first micro-light-emitting diode and the second micro-light-emitting diode may come from different wafers, there may be a difference in luminous intensity and a difference in emission wavelength between the two. In other words, the luminous intensity of the first micro-light-emitting diode and the second micro-light-emitting diode may be different, and there may be wavelength difference between the light emitted by the first micro-light-emitting diode and the light emitted by the second micro-light-emitting diode. Therefore, it can be seen in FIG. 5A that there is a difference in luminous intensity between the first strip 501 representing the first micro-light-emitting diode and the second strip 502 representing the second micro-light-emitting diode. The difference in luminous intensity may be less than 10%, preferably. Similarly, it can be seen in FIG. 5B that there is a light-emission wavelength difference between the first strip 501 representing the first micro-light-emitting diode and the second strip 502 representing the second micro-light-emitting diode. The difference in emission wavelength may be less than 10%, preferably. Or, the difference between the emission wavelength of the first micro-light-emitting diode and the emission wavelength of the second micro-light-emitting diode may be greater than or equal to 1 nm and less than or equal to 5 nm. When there is no great difference between the emission wavelength of the first micro-light-emitting diode and the emission wavelength of the second micro-light-emitting diode for replacing the defective microelectronic element, the condition of uneven display of the display panel may be avoided, and the inventory cost of the micro-light-emitting diode may be reduced effectively.

Figure 6A:
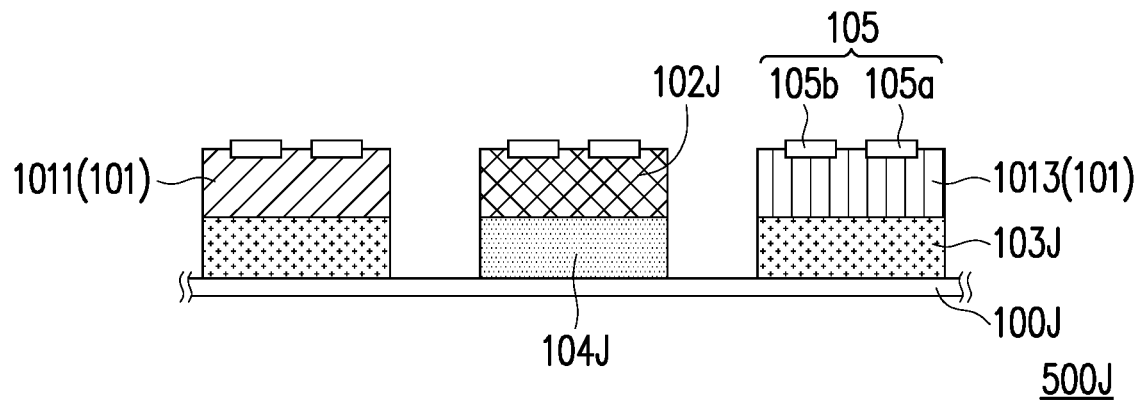
FIG. 6A is a schematic cross-sectional view of a second temporary substrate.
Figure 6B:
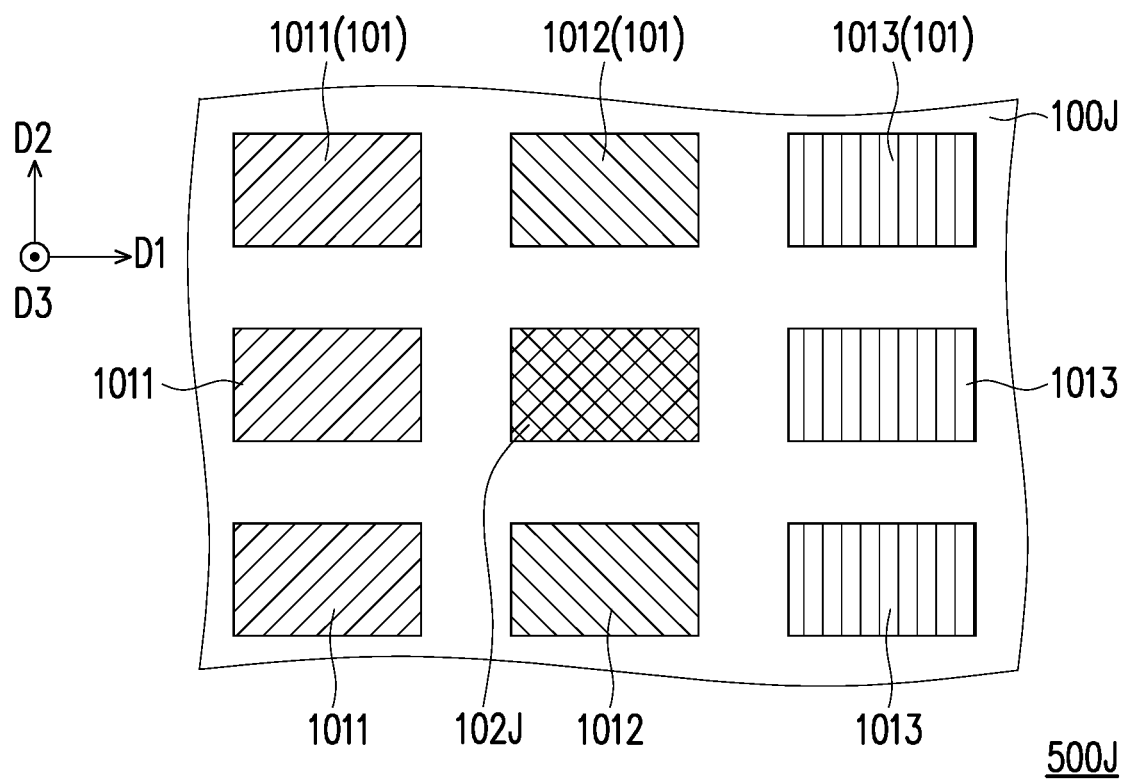
FIG. 6B is a schematic top view of a second temporary substrate.

FIG. 6A is a schematic cross-sectional view of a second temporary substrate, and FIG. 6B is a schematic top view of a second temporary substrate. Referring to FIG. 6A and FIG. 6B, when the microelectronic elements on the manufactured semiconductor structure 10 are further transferred onto a second temporary substrate 100J for a subsequent transfer requirement, a plurality of third buffer layers 103J are disposed on the second temporary substrate 100J, and a plurality of first microelectronic elements 101 are disposed on the third buffer layers 103J, wherein each of the first microelectronic elements 101 includes electrodes 105. The second temporary substrate 100J may be, for example, a plastic substrate, a ceramic substrate, a glass substrate, a sapphire substrate, a flexible substrate, an elastic substrate, or other substrates without driving circuit. Due to the issue of the yield of the process, there may be also at least one defective microelectronic element occurring on the second temporary substrate 100J. By the aforementioned method, the at least one defective microelectronic element on the second temporary substrate 100J may be replaced by at least one second microelectronic element 102J, wherein at least one fourth buffer layer 104J may be disposed on the second microelectronic element 102, and the second microelectronic element 102 is disposed on the fourth buffer layer 104J. In this way, there is no defective microelectronic element on the second temporary substrate 100J of the semiconductor structure 500J, so that the yield of the subsequently manufactured electronic device may be further increased, and the cost thereof is reduced. In other words, the embodiment of the present disclosure provides a manufacturing method of an electronic element module which replaces the defective microelectronic element on the second temporary substrate 100J, so that the manufactured semiconductor structure 500J has no defective microelectronic element, and the yield of the subsequently manufactured electronic device may thus be further increased, and the cost thereof is reduced.

Next, the semiconductor structure 500J is disposed opposite to the display substrate 106, and the first microelectronic elements 101 and the second microelectronic element 102J are transferred to the display substrate 106.

In the semiconductor structure 500J, the first microelectronic elements 101 and the at least one second microelectronic element 102J may include different properties. In this embodiment, the first microelectronic elements 101 and the at least one second microelectronic element 102J including different properties have different light-emission colors. For example, the first microelectronic elements 101 include red micro-light-emitting diodes 1011, green micro-light-emitting diodes 1012, and blue micro-light-emitting diodes 1013, and the second microelectronic element 102J may be a red micro-light-emitting diode, a green micro-light-emitting diode, or a blue micro-light-emitting diode. In FIG. 6A, the second microelectronic element 102J is a green micro-light-emitting diode disposed between the red micro-light-emitting diodes 1011 and the blue micro-light-emitting diodes 1013 to form a pixel for displaying.

In an embodiment, the second temporary substrate 100J may be a soft substrate, and the the first microelectronic elements 101 and the at least one second microelectronic element 102J are transferred to the display substrate 106 by a roll-to-roll manner. The pixel pitch and the pitch of the first microelectronic elements 101 and the at least one second microelectronic element 102J are well-determined on the second temporary substrate 100J to facilitate transferring the first microelectronic elements 101 and the at least one second microelectronic element 102J onto the display substrate 106. If a width difference between the first microelectronic element 101 and the second microelectronic element 102J, the pitch of the first microelectronic elements 101 and the at least one second microelectronic element 102J is greater than or equal to 3 times the width difference.

In FIG. 6A, the electrodes 105 are located on the top of the first microelectronic elements 101 and the second microelectronic element 102J. However, in other embodiments, the electrodes 105 are located on the bottom of the first microelectronic elements 101 and the second microelectronic element 102J and adjacent to the third buffer layer 103J and the fourth buffer layer 104J.

Figure 7:
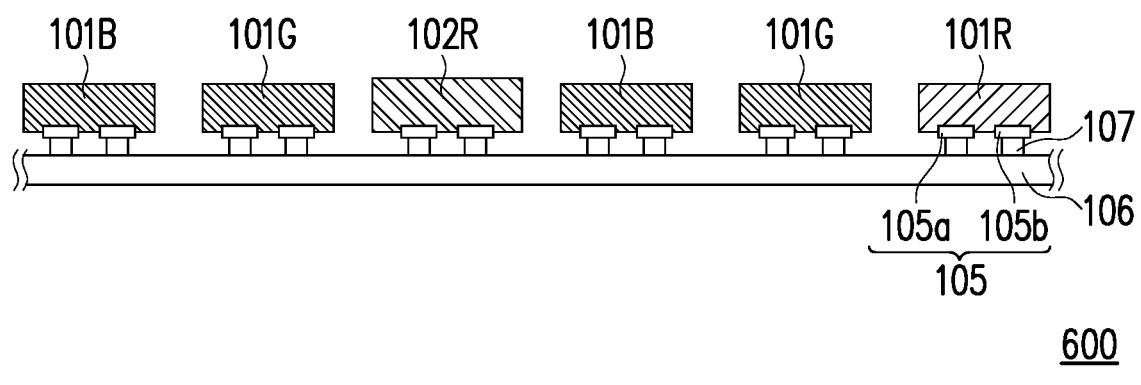
FIG. 7 shows a display panel according to an embodiment of the disclosure.

FIG. 7 shows a display panel according to an embodiment of the present disclosure. A display panel 600 includes a display substrate 106, red micro-light-emitting diodes 101R and 102R, green micro-light-emitting diodes 101G, and blue micro-light-emitting diodes 101B. And the display substrate 106 includes a driving circuit layer 107. The appearance (size and apparent color) of the red micro-light-emitting diode 102R is different from the appearance of the red micro-light-emitting diode 101R; there is an appearance difference between the two. According to an embodiment of the disclosure, there is wavelength difference between the light emitted by the red micro-light-emitting diode 101R and the light emitted by the red micro-light-emitting diode 102R.

In sum, the manufacturing method of an electronic element module provided by embodiments of the present disclosure replaces defective microelectronic elements on a temporary substrate, so that there are no defective microelectronic elements on the temporary substrate, thereby improving production yield of electronic modules subsequently manufactured (such as display panels) and reducing production costs.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A semiconductor structure, comprising:
   a temporary substrate;
   a plurality of first micro-light-emitting diodes; and
   at least one second micro-light-emitting diode,
   wherein the first micro-light-emitting diodes and the at least one second micro-light-emitting diode are distributed on the temporary substrate, the first micro-light-emitting diodes and the at least one second micro-light-emitting diode comprise same properties, and at least one of an appearance difference, a height difference, and an orientation difference exists between the first micro-light-emitting diodes and the at least one second micro-light-emitting diode,
   wherein the first micro-light-emitting diodes and the at least one second micro-light-emitting diode comprising a same light-emission color, and at least one of a light-emission wavelength difference and a luminous-intensity difference exists between the first micro-light-emitting diodes and the at least one second micro-light-emitting diode.

2. The semiconductor structure according to claim 1, wherein the semiconductor structure further comprises a first buffer layer and a second buffer layer, wherein the first buffer layer is disposed between the first micro-light-emitting diodes and the temporary substrate, the second buffer layer is disposed between the at least one second micro-light-emitting diode and the temporary substrate, and at least one of a material difference, an appearance difference, a height difference, and an orientation difference exists between the first buffer layer and the second buffer layer.

3. The semiconductor structure according to claim 2, wherein a thickness of the second buffer layer is greater than a thickness of the first buffer layer.

4. The semiconductor structure according to claim 2, wherein a Young's modulus of the second buffer layer is less than a Young's modulus of the first buffer layer.

5. The semiconductor structure according to claim 1, wherein the appearance difference between the first micro-light-emitting diodes and the at least one second micro-light-emitting diode is an apparent-color difference.

6. The semiconductor structure according to claim 1, wherein the appearance difference between the first micro-light-emitting diodes and the at least one second micro-light-emitting diode is a size difference, and the size difference meets a conditional formula: $0<D12/W1\leq10\%$, wherein W1 is a width of each of the first micro-light-emitting diodes in a direction perpendicular to a normal line of the temporary substrate, D12 is a width difference between each of the first micro-light-emitting diodes and the at least one second micro-light-emitting diode in the direction, and D12 is a positive number.

7. The semiconductor structure according to claim 1, wherein the number of the at least one second micro-light-emitting diode is plural, and the orientation differences between the first micro-light-emitting diodes and the second micro-light-emitting diodes are the same.

8. The semiconductor structure according to claim 1, wherein the temporary substrate includes a vacancy position where a first micro-light-emitting diode is removed.

9. A display panel, comprising:
a display substrate;
a plurality of first micro-light-emitting diodes; and
at least one second micro-light-emitting diode,
wherein the first micro-light-emitting diodes and the at least one second micro-light-emitting diode are distributed on the display substrate and electrically connected to the display substrate, and the first micro-light-emitting diodes and the at least one second micro-light-emitting diode comprise same properties, and at least one of an appearance difference, a height difference, and an orientation difference exists between the first micro-light-emitting diodes and the at least one second micro-light-emitting diode,
wherein the first micro-light-emitting diodes and the at least one second micro-light-emitting diode comprising a same light-emission color, and at least one of a light-emission wavelength difference and a luminous-intensity difference exists between the first micro-light-emitting diodes and the at least one second micro-light-emitting diode.

10. The display panel according to claim 9, wherein the appearance difference between the first micro-light-emitting diodes and the at least one second micro-light-emitting diode is an apparent-color difference.

11. The display panel according to claim 9, wherein the appearance difference between the first micro-light-emitting diodes and the at least one second micro-light-emitting diode is a size difference, and the size difference meets a conditional formula: $0<D12/W1\leq10\%$, wherein W1 is a width of each of the first micro-light-emitting diodes in a direction perpendicular to a normal line of the display substrate, D12 is a width difference between each of the first micro-light-emitting diodes and the at least one second micro-light-emitting diode in the direction, and D12 is a positive number.

12. The display panel according to claim 9, wherein the number of the at least one second micro-light-emitting diode is plural, and the orientation differences between the first micro-light-emitting diodes and the second micro-light-emitting diodes are the same.

* * * * *